US008692510B2

(12) United States Patent  (10) Patent No.: US 8,692,510 B2
Kita  (45) Date of Patent: Apr. 8, 2014

(54) BATTERY CHARGER, VOLTAGE MONITORING DEVICE AND SELF-DIAGNOSIS METHOD OF REFERENCE VOLTAGE CIRCUIT

(75) Inventor: Yukihiro Kita, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 449 days.

(21) Appl. No.: 13/172,990

(22) Filed: Jun. 30, 2011

(65) Prior Publication Data

US 2012/0001588 A1  Jan. 5, 2012

(30) Foreign Application Priority Data

Jul. 2, 2010 (JP) ................ 2010-152225

(51) Int. Cl.
*H02J 7/00* (2006.01)
*H02J 7/04* (2006.01)

(52) U.S. Cl.
USPC ........................................................ 320/107

(58) Field of Classification Search
USPC ......... 320/107, 112, 132, 133, 134, 136, 113, 320/114, 115, 144, 145, 160; 324/76.11, 324/429
See application file for complete search history.

(56) References Cited

U.S. PATENT DOCUMENTS

| | | | | |
|---|---|---|---|---|
| 5,650,712 A | * | 7/1997 | Kawai et al. | 324/427 |
| 6,252,376 B1 | * | 6/2001 | Nakamura et al. | 320/132 |
| 6,621,250 B1 | * | 9/2003 | Ohkubo et al. | 320/136 |
| 7,009,537 B2 | * | 3/2006 | Kabune | 341/120 |
| 7,323,848 B2 | * | 1/2008 | Fujihara et al. | 320/132 |
| 8,324,861 B2 | * | 12/2012 | Huo et al. | 320/116 |
| 2001/0035742 A1 | * | 11/2001 | Ito et al. | 320/157 |
| 2003/0085626 A1 | * | 5/2003 | Odaohhara | 307/150 |
| 2005/0017684 A1 | * | 1/2005 | Brecht | 320/131 |
| 2012/0001588 A1 | * | 1/2012 | Kita | 320/107 |

FOREIGN PATENT DOCUMENTS

| | | |
|---|---|---|
| JP | 08-056160 | 2/1996 |
| JP | 2003-319565 | 11/2003 |
| JP | 2009-038857 | 2/2009 |

* cited by examiner

*Primary Examiner* — Edward Tso
*Assistant Examiner* — Alexis Boateng
(74) *Attorney, Agent, or Firm* — Volentine & Whitt, PLLC

(57) ABSTRACT

Disclosed is a battery charger including a battery cell, a reference voltage generating section, an A/D converting section including an A/D converter and a control section. The reference voltage generating section includes a first reference voltage circuit generating a first reference voltage and a second reference voltage circuit generating a second reference voltage equal to the first reference voltage. To diagnose the A/D converter, the first reference voltage circuit is used. To diagnose the first reference voltage circuit, a second A/D conversion value obtained by A/D converting a second divided voltage of the second reference voltage via the A/D converter using the first reference voltage is compared with a first reference value obtained by A/D converting a first divided voltage of the first reference voltage via the A/D converter using the first reference voltage when the first reference voltage circuit is normal.

7 Claims, 4 Drawing Sheets

BATTERY CHARGER, VOLTAGE MONITORING DEVICE AND SELF-DIAGNOSIS METHOD OF REFERENCE VOLTAGE CIRCUIT

CROSS-REFERENCE TO RELATED APPLICATION

This application claims priority under 35 USC 119 from Japanese Patent Application No. 2010-152225 filed on Jul. 2, 2010, the disclosure of which is incorporated by reference herein.

BACKGROUND

1. Technical Field

The present invention relates to a battery charger, a voltage monitoring device and a self-diagnosis method of a reference voltage circuit.

2. Related Art

In recent years, a voltage adjusting device has been used in a battery for a vehicle or the like. For example, Japanese Patent Application Laid-Open (JP-A) No. 2009-38857 discloses a voltage adjusting device that measures a voltage of each of a plurality of battery cells connected in series to each other using a voltage detecting circuit and repeats a charging/discharging operation in accordance with variations in the entire battery cells.

On the other hand, JP-A No. 2003-319565 discloses a charging monitoring device including a voltage measuring unit that has an attenuator decreasing a voltage across terminals of a battery in accordance with a predetermined ratio, an A/D converter A/D converting the output voltage of the attenuator, and a reference voltage generating circuit supplying an A/D conversion reference voltage to the A/D converter, and a charging monitoring control section that executes and controls a process of monitoring a charging condition on the basis of information of the voltage measuring unit and the like.

According to the battery charging control device of JP-A No. 2003-319565, as a method of determining an abnormal operation of the voltage measuring unit, there is disclosed a method of determining that the voltage measuring unit is abnormal when a measurement value of the voltage measuring unit is not abnormal even when the charging condition of the battery is abnormal.

However, in the abnormality detecting method of the voltage measuring unit disclosed in JP-A No. 2003-319565, an abnormality of the voltage measuring unit cannot be detected when the charging condition of the battery is not clearly abnormal. For this reason, when the method is applied to, for example, a battery for a vehicle or the like, there is a concern in that an erroneous operation due to the abnormal charging condition, disconnection of a power supply line, ignition, or the like may be caused. Therefore, it is not desirable to adopt the method since the method is very dangerous from the viewpoint of maintaining safety.

Further, JP-A No. 8-56160 discloses a technique for checking an operation of the A/D converter in a manner such that a predetermined reference voltage obtained in a test mode is input to the A/D converter and conversion data is compared with the predetermined value to determine whether the two are equal to each other.

An object of the present invention is to provide a battery charger capable of detecting abnormality of an A/D converter and a reference voltage circuit, a voltage monitoring device and a self-diagnosis method of a reference voltage circuit.

SUMMARY

According to a first aspect of the present invention, there is provided a battery charger including:
a battery cell;
a reference voltage generating section;
an A/D converting section; and
a control section,
wherein the reference voltage generating section includes a first reference voltage circuit generating a first reference voltage and a second reference voltage circuit generating a second reference voltage equal to the first reference voltage,
wherein the A/D converting section includes an A/D converter, a connection switching section, and a connection switching control section controlling the connection switching section,
wherein the control section includes a comparing section,
wherein when a charging condition of the battery cell is monitored, the control section controls the A/D converting section to connect the battery cell to the A/D converter and to output a first A/D conversion value by A/D converting a voltage value of the battery cell via the A/D converter using the first reference voltage, and the control section controls the comparing section to compare the first A/D conversion value with a predetermined first reference value,
wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and
wherein when characteristics of the first reference voltage circuit are diagnosed, the control section controls the A/D converting section to connect the A/D converting section to a second divided voltage output section outputting a second divided voltage of the second reference voltage of the second reference voltage circuit so that a voltage dividing ratio of the second divided voltage with respect to the second reference voltage is equal to a voltage dividing ratio of the first divided voltage with respect to the first reference voltage and to output a third A/D conversion value obtained by A/D converting the second divided voltage via the A/D converter using the first reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a second aspect of the present invention, there is provided a battery charger including:
a battery cell;
a reference voltage generating section;
an A/D converting section; and
a control section,
wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein the control section includes a comparing section, wherein when a charging condition of the battery cell is monitored, the control section controls the A/D converting section to connect the battery cell to the A/D converter and to output a first A/D conversion value by A/D converting a voltage value of the battery cell via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to the first divided voltage output section outputting the first divided voltage of the first reference voltage of the first reference voltage circuit and to output a third A/D conversion value obtained by A/D converting the first divided voltage via the A/D converter using the second reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a third aspect of the present invention, there is provided a battery charging control device including:

a battery cell connection terminal to be connected to a battery cell;

a reference voltage generating section;

an A/D converting section; and a control section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein the control section includes a comparing section, wherein when a charging condition of the battery cell is monitored, the control section controls the A/D converting section to connect the battery cell connection terminal to the A/D converter and to output a first A/D conversion value by A/D converting a voltage value of the battery cell via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to a second divided voltage output section outputting a second divided voltage of the second reference voltage of the second reference voltage circuit so that a voltage dividing ratio of the second divided voltage with respect to the second reference voltage is equal to a voltage dividing ratio of the first divided voltage with respect to the first reference voltage and to output a third A/D conversion value obtained by A/D converting the second divided voltage via the A/D converter using the first reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a fourth aspect of the present invention, there is provided a battery charging control device including:

a battery cell connection terminal to be connected to a battery cell;

a reference voltage generating section;

an A/D converting section; and a control section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein the control section includes a comparing section, wherein when a charging condition of the battery cell is monitored, the control section controls the A/D converting section to connect the battery cell connection terminal to the A/D converter and to output a first A/D conversion value by A/D converting a voltage value of the battery cell via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to the first divided voltage output section outputting the first divided voltage of the first reference voltage of the first reference voltage circuit and to output a third A/D conversion value obtained by A/D converting the first divided voltage via the A/D converter using the second reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a fifth aspect of the present invention, there is provided a voltage monitoring device comprising:

a connection terminal to be connected to a voltage monitoring target;

a reference voltage generating section;

an A/D converting section; and a control section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein the control section includes a comparing section, wherein when a voltage of the voltage monitoring target is monitored, the control section controls the A/D converting section to connect the connection terminal to the A/D converter and to output a first A/D conversion value by A/D converting a voltage value of the voltage monitoring target via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to a second divided voltage output section outputting a second divided voltage of the second reference voltage of the second reference voltage circuit so that a voltage dividing ratio of the second divided voltage with respect to the second reference voltage is equal to a voltage dividing ratio of the first divided voltage with respect to the first reference voltage and to output a third A/D conversion value obtained by A/D converting the second divided voltage via the A/D converter using the first reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a sixth aspect of the present invention, there is provided a voltage monitoring device including:

a connection terminal to be connected to a voltage monitoring target;

a reference voltage generating section;

an A/D converting section; and a control section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein the control section includes a comparing section, wherein when a voltage of the voltage monitoring target is monitored, the control section controls the A/D converting section to connect the connection terminal to the A/D converter and to output a first A/D conversion value by A/D converting a voltage value of the voltage monitoring target via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to the first divided voltage output section outputting the first divided voltage of the first reference voltage of the first reference voltage circuit and to output a third A/D conversion value obtained by A/D converting the first divided voltage via the A/D converter using the second reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

According to a seventh aspect of the present invention, there is provided an A/D converting device including:

a connection terminal to be connected to an A/D conversion subject;

a reference voltage generating section; and an A/D converting section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein when the A/D conversion subject is A/D converted, the connection switching control section controls the connection switching section to connect the connection terminal to the A/D converter, and a first A/D conversion value is output that is obtained by A/D converting a voltage value of the A/D conversion subject via the A/D converter using the first reference voltage, wherein when characteristics of the A/D converter are diagnosed, the connection switching control section controls the connection switching section to connect the A/D converting section to a first divided voltage output section outputting a first divided voltage of the first reference voltage of the first reference voltage circuit, and a second A/D conversion value is output that is obtained by A/D converting the first divided voltage via the A/D converter using the first reference voltage, and wherein when characteristics of the first reference voltage circuit are diagnosed, the connection switching control section controls the connection switching section to connect the A/D converting section to a second divided voltage output section outputting a second divided voltage of the second reference voltage of the second reference voltage circuit so that the voltage dividing ratio of the second divided voltage with respect to the second reference voltage is equal to the voltage dividing ratio of the first divided voltage with respect to the first reference voltage, and a third A/D conversion value is output that is obtained by A/D converting the second divided voltage via the A/D converter using the first reference voltage.

According to a eighth aspect of the present invention, there is provided an A/D converting device including:

a connection terminal to be connected to an A/D conversion subject;

a reference voltage generating section; and an A/D converting section, wherein the reference voltage generating section includes a first reference voltage circuit generating a first reference voltage and a second reference voltage circuit generating a second reference voltage equal to the first reference voltage, wherein the A/D converting section includes an A/D converter, a connection switching section, and a connection switching control section controlling the connection switching section, wherein when the A/D conversion subject is A/D converted, the connection switching control section controls the connection switching section to connect the connection terminal to the A/D converter, and a first A/D conversion value is output that is obtained by A/D converting a voltage value of the A/D conversion subject via the A/D converter using the first reference voltage, wherein when characteristics of the A/D converter are diagnosed, the connection switching control section controls the connection switching section to connect the A/D converting section to a first divided voltage output section outputting a first divided voltage of the first reference voltage of the first reference voltage circuit, and a second A/D conversion value is output that is obtained by A/D converting the first divided voltage via the A/D converter using the first reference voltage, and wherein when characteristics of the first reference voltage circuit are diagnosed, the connection switching control section controls the connection switching section to connect the A/D converting section to the first divided voltage output section outputting the first divided voltage of the first reference voltage of the first reference voltage circuit, and a third A/D conversion value is output that is obtained by A/D converting the first divided voltage via the A/D converter using the second reference voltage.

According to a ninth aspect of the present invention, there is provided a self-diagnosis method of a reference voltage circuit supplying an A/D conversion reference voltage to an A/D converter including:

connecting an A/D converting section to a first divided voltage output section outputting a first divided voltage of the reference voltage of the reference voltage circuit, obtaining a first A/D conversion value by A/D converting the first divided voltage via the A/D converter using the reference voltage, and comparing the first A/D conversion value with a first reference value obtained by A/D converting the first divided voltage via the A/D converter using the reference voltage when the A/D converter is normal; and connecting the A/D converting section to a second divided voltage output section outputting a second divided voltage of a second reference voltage of a second reference voltage circuit generating the second reference voltage equal to the reference voltage so that the voltage dividing ratio of the second divided voltage with respect to the second reference voltage is equal to the voltage dividing ratio of the first divided voltage with respect to the reference voltage when the first A/D conversion value is equal to the first reference value, obtaining a second A/D conversion value by A/D converting the second divided voltage via the A/D converter using the reference voltage, and comparing the second A/D conversion value with a second reference value obtained by A/D converting the first divided voltage via the A/D converter using the reference voltage when the reference voltage circuit is normal in the case where the A/D converter and the reference voltage circuit are normal.

According to a tenth aspect of the present invention, there is provided a self-diagnosis method of a reference voltage circuit supplying an A/D conversion reference voltage to an A/D converter including:

connecting an A/D converting section to a first divided voltage output section outputting a first divided voltage of the reference voltage of the reference voltage circuit, obtaining a first A/D conversion value by A/D converting the first divided voltage via the A/D converter using the reference voltage, and comparing the first A/D conversion value with a first reference value obtained by A/D converting the first divided voltage via the A/D converter using the reference voltage when the A/D converter is normal; and connecting the A/D converting section to the first divided voltage output section outputting the first divided voltage of the reference voltage of the reference voltage circuit when the first A/D conversion value is equal to the first reference value, obtaining a second A/D conversion value by A/D converting the first divided voltage via the A/D converter using a second reference voltage of a second reference voltage circuit generating the second reference voltage equal to the reference voltage, and comparing the second A/D conversion value with a second reference value obtained by A/D converting the first divided voltage via the A/D converter using the reference voltage when the reference voltage circuit is normal in the case where the A/D converter and the reference voltage circuit are normal.

BRIEF DESCRIPTION OF THE DRAWINGS

An exemplary embodiment of the present invention will be described in detail based on the following figures, wherein.

DETAILED DESCRIPTION

Hereinafter, exemplary embodiments of the present invention will be described by referring to the drawings.

An accident such as ignition may take place when a secondary battery, and more particularly, a lithium ion secondary battery, is charged by an incorrect method. For this reason, there is a need to manage a battery charging voltage and a battery charging current within conditions designated by a manufacturer during a charging operation.

When a voltage is measured by a battery monitoring IC, measurement errors of an A/D converter (ADC) need to be minimized because of the above-described reasons. The A/D converter needs to have a high resolution, but may have a mechanism capable of periodically diagnosing an error caused by deterioration over time. The error of the A/D converter may be caused by deterioration of the A/D converter and deterioration of a reference voltage circuit (VREF).

In the past, JP-A No. 2003-319565 disclosed a method of diagnosing a voltage measuring unit. This technique diagnoses whether there are deterioration and abnormality by inspecting abrupt temporal variations in the measurement value. However, in the equipment with the above-described configuration, a gradual deterioration in the characteristic cannot be detected. According to the embodiments of the invention, there is provided equipment capable of detecting even a gradual deterioration in the characteristic.

First Embodiment

Figure 1:
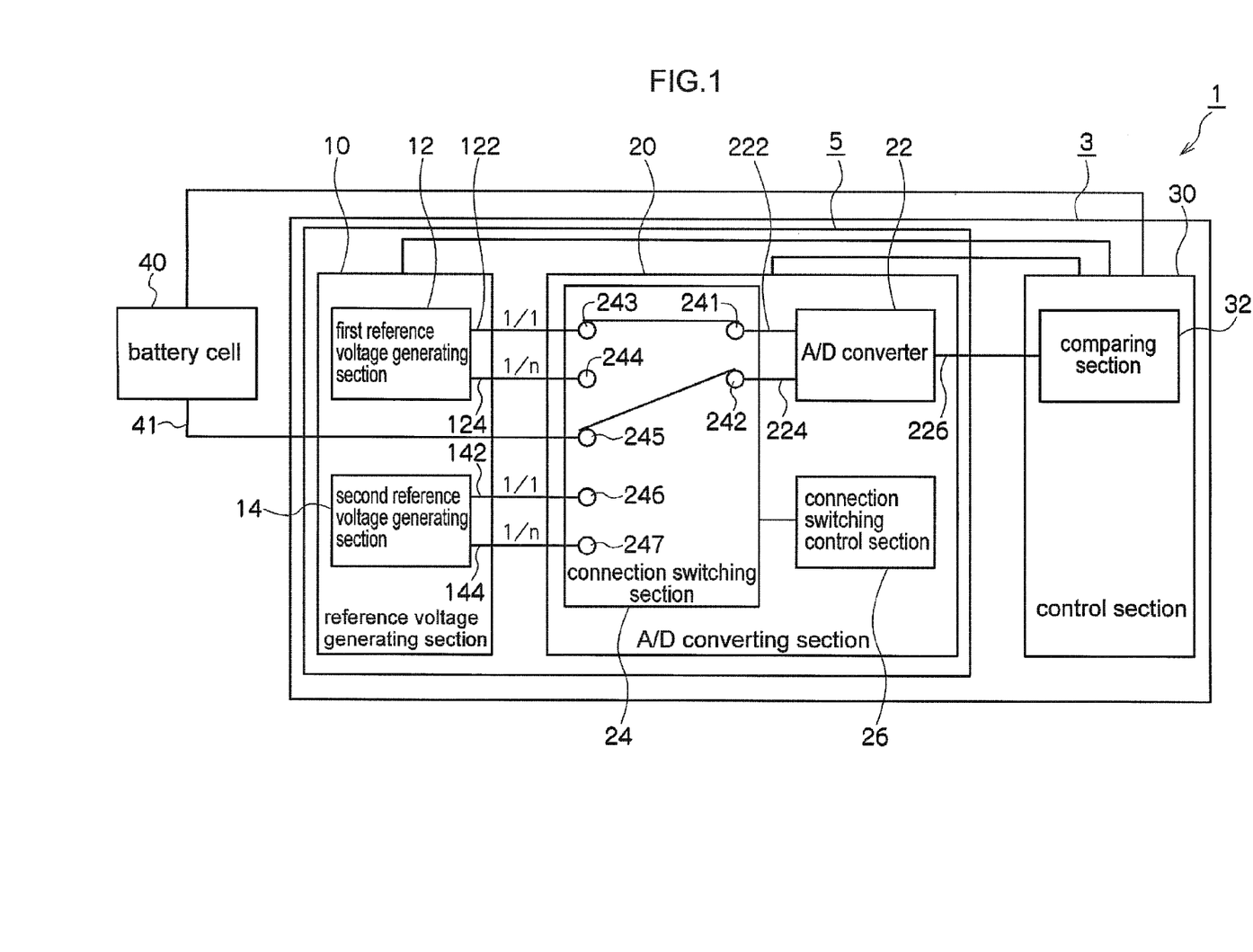
FIG. 1 is a schematic diagram for explaining a battery charger in accordance with a first embodiment of the present invention.
Figure 2:
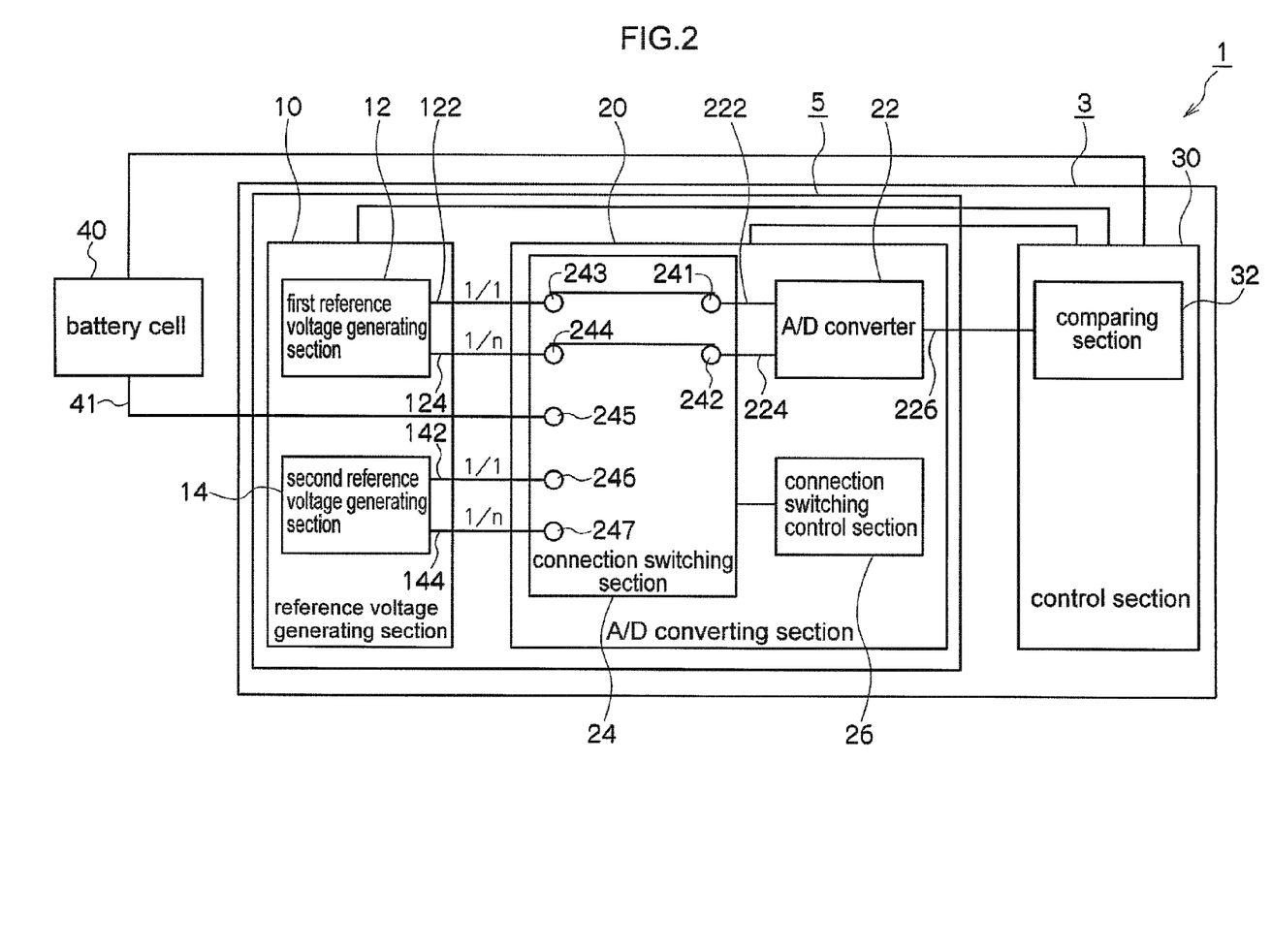
FIG. 2 is a schematic diagram for explaining a battery charger in accordance with a first embodiment of the present invention.
Figure 3:
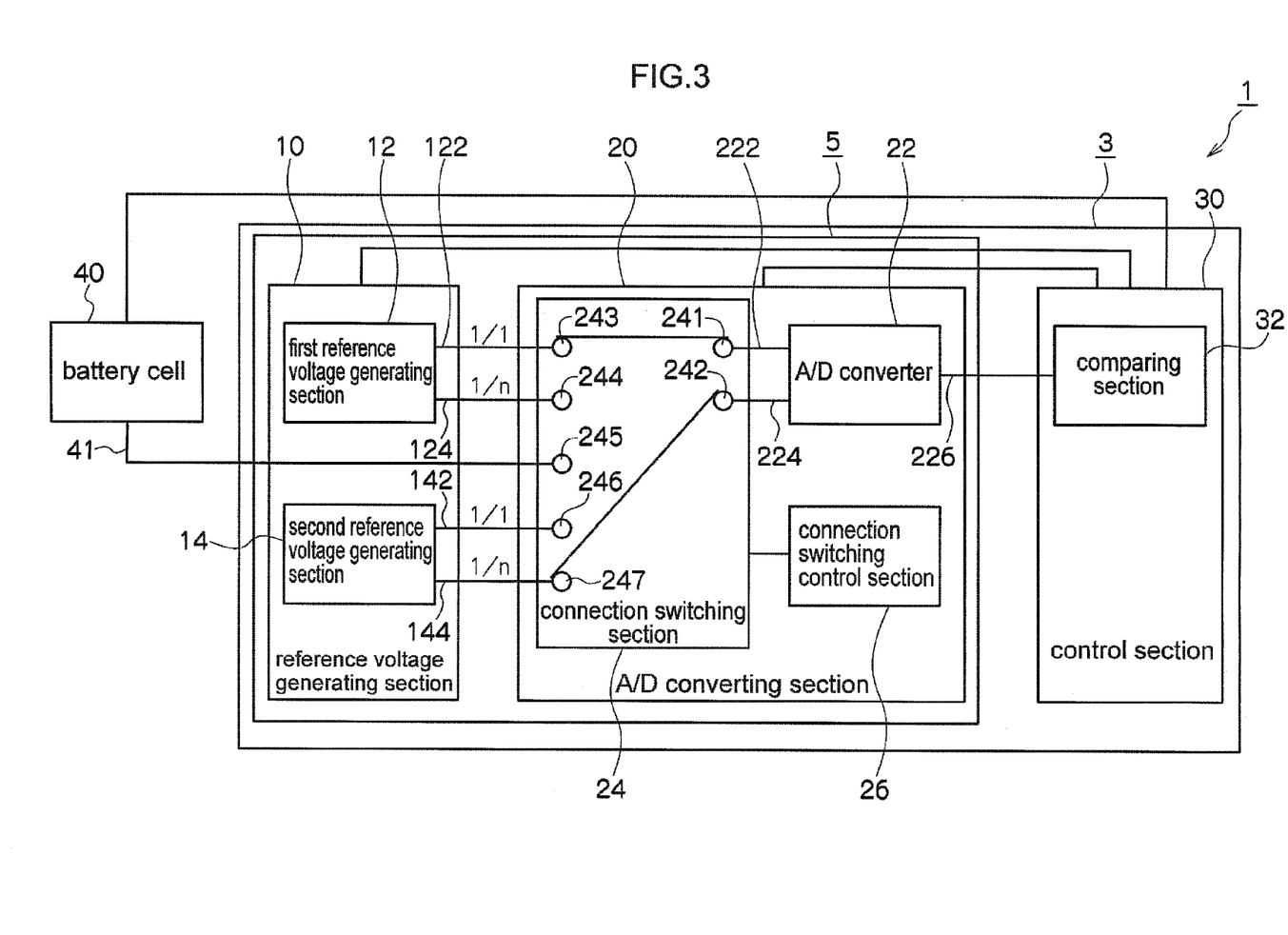
FIG. 3 is a schematic diagram for explaining a battery charger in accordance with a first embodiment of the present invention.

Referring to FIGS. 1 to 3, a battery charger 1 of the first embodiment includes a battery charging control device 3 and a battery cell 40. The battery charging control device 3 includes an A/D converting device 5 and a control section 30. The A/D converting device 5 includes a reference voltage generating section 10 and an A/D converting section 20. The reference voltage generating section 10 includes a first reference voltage generating circuit 12 and a second reference voltage generating circuit 14. The A/D converting section 20 includes an A/D converter 22, a connection switching section 24, and a connection switching control section 26. The control section 30 includes a comparing section 32.

The charging operation of the battery cell 40 is controlled and monitored by the battery charging control device 3. The battery charging control device 3 is configured as, for example, a battery charging IC. The control section 30 controls the first reference voltage generating circuit 12 and the second reference voltage generating circuit 14 of the reference voltage generating section 10, the A/D converter 22 and the connection switching control section 26 of the A/D converting section 20, the comparing section 32, and the battery cell 40. The connection switching section 24 is controlled by the connection switching control section 26. The control section 30 is configured as, for example, a microcomputer.

The first reference voltage generating circuit 12 includes a first reference voltage output terminal 122 which outputs a first reference voltage V1 and a first divided voltage output section 124 which outputs a first divided voltage V1/n corresponding to 1/n (n is an integer) of the first reference voltage. The first divided voltage V1/n is a voltage except for 0 V and the first reference voltage. The second reference voltage generating circuit 14 includes a second reference voltage output terminal 142 which outputs a second reference voltage V2 and a first divided voltage output section 144 which outputs a second divided voltage V2/n corresponding to 1/n (n is an integer) of the second reference voltage. The first reference voltage V1 and the second reference voltage V2 are set to the same value (V1=V2). The divided voltage ratio of the second divided voltage with respect to the second reference voltage is equal to the divided voltage ratio of the first divided voltage with respect to the first reference voltage, and is 1/n.

The A/D converter 22 includes a reference voltage input section 222, an A/D conversion voltage input section 224, and an A/D conversion value output section 226. The A/D conversion value output section 226 is connected to the comparing section 32, and the A/D conversion value that is A/D converted by the A/D converter 22 is input to the comparing section 32.

The connection switching section 24 includes a terminal 241 that is connected to the reference voltage input section 222 of the A/D converter 22, a terminal 242 that is connected to the A/D conversion voltage input section 224 of the A/D converter 22, a terminal 243 that is connected to the first reference voltage output terminal 122 of the first reference voltage generating circuit 12, a terminal 244 that is connected to the first divided voltage output section 124 of the first reference voltage generating circuit 12, a terminal 245 that is connected to a voltage output terminal 41 of the battery cell 40, a terminal 246 that is connected to the second reference voltage output terminal 142 of the second reference voltage generating circuit 14, and a terminal 247 that is connected to the second divided voltage output section 144 of the second reference voltage generating circuit 14. Through the control of the connection switching control section 26, the connection between the terminal 241 and the terminals 243 and 246 is switched, and the connection between the terminal 242 and the terminals 244, 245, and 247 is switched.

Referring to FIG. 1, the battery charging monitoring operation of the battery cell 40 will be described. The connection switching control section 26 is controlled through the control of the control section 30, and the connection switching section 24 is controlled through the control of the connection switching control section 26, so that the first reference voltage output terminal 122 of the first reference voltage generating circuit 12 is connected to the reference voltage input section 222 of the A/D converter 22 by connecting the terminal 241 and the terminal 243 to each other and the voltage output terminal 41 of the battery cell 40 is connected to the A/D conversion voltage input section 224 of the A/D converter 22 by connecting the terminal 242 and the terminal 245 to each other.

The first reference voltage V1 is supplied from the first reference voltage output terminal 122 of the first reference voltage generating circuit 12 to the reference voltage input section 222 of the A/D converter 22, the output voltage Vb of the battery cell 40 is supplied to the A/D conversion voltage input section 224 of the A/D converter 22, and the A/D conversion value of the output voltage Vb of the battery cell 40, which is A/D converted using the first reference voltage V1 as a reference, is output to the comparing section 32 by the A/D converter 22. For example, when the first reference voltage V1 is 5 V and the output voltage Vb of the battery cell 40 is 2.5 V, 2.5 V is A/D converted with 5 V as a reference. For example, in the case of 4 bits, "0111" is output with respect to "1111".

The output A/D conversion value is input to the comparing section 32 installed in the control section 30, and is compared with a predetermined reference voltage. Through this operation, the charging operation of the battery cell 40 is monitored.

Furthermore, only the first reference voltage generating circuit 12 is used to monitor the charging operation of the battery cell 40, and the second reference voltage generating circuit 14 is shut down and is not operated. The second reference voltage generating circuit 14 is activated only in the case of diagnosing the A/D converting device 5 to be described later.

Next, referring to FIG. 2, the diagnosis operation of the A/D converter 22 in the diagnosis operation of the A/D converting device 5 will be described. The connection switching control section 26 is controlled through the control of the control section 30 and the connection switching section 24 is controlled through the control of the connection switching control section 26, so that the first reference voltage output terminal 122 of the first reference voltage generating circuit 12 is connected to the reference voltage input section 222 of the A/D converter 22 by connecting the terminal 241 and the terminal 243 to each other, and the first divided voltage output section 124 of the first reference voltage generating circuit 12 is connected to the A/D conversion voltage input section 224 of the A/D converter 22 by connecting the terminal 242 and the terminal 244 to each other.

The first reference voltage V1 is supplied from the first reference voltage output terminal 122 of the first reference voltage generating circuit 12 to the reference voltage input section 222 of the A/D converter 22, the first divided voltage V1/$n$ is input from the first divided voltage output section 124 of the first reference voltage generating circuit 12 to the A/D conversion voltage input section 224 of the A/D converter 22, and the A/D conversion value of the first divided voltage V1/$n$, which is A/D converted using the first reference voltage V1 as a reference, is output to the comparing section 32 by the A/D converter 22.

The A/D conversion value of the output first divided voltage V1/$n$ is input to the comparing section 32 installed in the control section 30, and is compared with the A/D conversion value of the predetermined desired first divided voltage V1/$n$ output when the A/D converter 22 is normal.

When the two are equal to each other, it is determined that the A/D converter 22 is normally operated, and then the current step proceeds to the step of diagnosing whether the first reference voltage generating circuit 12 is normal.

When the two are not equal to each other, it is determined that there is a problem in the A/D converter 22, so that the operation of the application is stopped and the charging operation of the battery cell 40 is stopped.

For example, when the first reference voltage V1 is 5 V and the first divided voltage V1/$n$ is 2.5 V, 2.5 V is A/D converted on the basis of 5 V. For example, in the case of 4 bits, "0111" is output with respect to "1111". In this case, when the first reference voltage generating circuit 12 deteriorates, so that the first reference voltage V1 becomes V1' of 4 V at 5 V, the first divided voltage V1'/n becomes 2 V. Since the A/D converter 22 A/D converts the first divided voltage V1'/n (=2 V) on the basis of the first reference voltage V1'(=4 V), "0111" is output as the A/D conversion value with respect to "1111". In this manner, if the A/D converter 22 is normal even when the first reference voltage generating circuit 12 deteriorates, the A/D conversion value of the first divided voltage V1'/n is equal to the A/D conversion value of the first divided voltage V1/$n$ that is output when the A/D converter 22 is normal. For this reason, it is determined that the A/D converter 22 is normal.

When it is determined that the A/D converter 22 is normal, the first reference voltage circuit 12 is diagnosed. Referring to FIG. 3, the diagnosis operation of the first reference voltage circuit 12 in the diagnosis operation of the A/D converting device 5 will be described. The connection switching control section 26 is controlled through the control of the control section 30 and the connection switching section 24 is controlled through the control of the connection switching control section 26, so that the first reference voltage output terminal 122 of the first reference voltage generating circuit 12 is connected to the reference voltage input section 222 of the A/D converter 22 by connecting the terminal 241 and the terminal 243 to each other, and the second divided voltage output section 144 of the second reference voltage generating circuit 14 is connected to the A/D conversion voltage input section 224 of the A/D converter 22 by connecting the terminal 242 and the terminal 247 to each other.

The first reference voltage V1 is supplied from the first reference voltage output terminal 122 of the first reference voltage generating circuit 12 to the reference voltage input section 222 of the A/D converter 22, the second divided voltage V2/$n$ is input from the second divided voltage output section 144 of the second reference voltage generating circuit 14 to the A/D conversion voltage input section 224 of the A/D converter 22, and the A/D conversion value of the second divided voltage V2/$n$, which is A/D converted using the first reference voltage V1 as a reference, is output to the comparing section 32 by the A/D converter 22.

The A/D conversion value of the output second divided voltage V2/$n$ is input to the Comparing section 32 installed in the control section 30, and is compared with the A/D conversion value of the predetermined desired first divided voltage V1/$n$, which is output on the basis of the first reference voltage V1 when the first reference voltage generating circuit 12 is normal when the A/D converter 22 and the first reference voltage generating circuit 12 are normal.

Since the second divided voltage V2/$n$ and the first divided voltage V1/$n$ are equal to each other when the first reference voltage generating circuit 12 is normal, it is determined that the first reference voltage generating circuit 12 does not deteriorate when the A/D conversion value of the output second divided voltage V2/$n$ is equal to the A/D conversion value of the predetermined desired first divided voltage V1/$n$, and the operation of the application is continued.

When the two are not equal to each other, it is determined that the first reference voltage generating circuit 12 deteriorates, so that the operation of the application is stopped and the charging operation of the battery cell 40 is stopped.

For example, when the first reference voltage V1 is 5 V in the case where the first reference voltage generating circuit 12 is normal and the first divided voltage V1/$n$ is 2.5 V, the second reference voltage V2 is 5 V and the second divided voltage V2/$n$ is 2.5 V. As a result, 2.5 V of the second divided voltage V2/$n$ is A/D converted on the basis of 5 V of the first reference voltage V1. For example, in the case of 4 bits, "0111" is output with respect to "1111". In this case, when the first reference voltage generating circuit 12 deteriorates, so that the first reference voltage V1 becomes V1' of 4V at 5 V, since the A/D converter 22 A/D converts the second divided voltage V2/$n$ (=2.5 V) on the basis of the first reference voltage V1' (=4 V), "1001" is output as the A/D conversion value with respect to "1111", so that the A/D conversion values are not equal to each other.

Only the first reference voltage generating circuit 12 is used to monitor the charging operation of the battery cell 40, and the second reference voltage generating circuit 14 is shut down and is not operated. The second reference voltage generating circuit 14 is activated only when diagnosing the first reference voltage generating circuit 12 of the A/D converting device 5. For this reason, the deterioration degree of the second reference voltage generating circuit 14 is very small. For this reason, when it is determined whether the A/D conversion value of the second divided voltage V2/n based on the first reference voltage V1 is a specified value, the deterioration of the first reference voltage generating circuit 12 may be determined.

As described above, according to the first embodiment, since the reference voltage generating circuit 14 is additionally provided, it is possible to determine whether the A/D converter 22 deteriorates or the reference voltage generating circuit 12 deteriorates. When the deterioration determining step of the A/D converter 22 and the reference voltage generating circuit 12 is periodically performed during the charging monitoring step of the battery cell 40, it is possible to detect the abnormality of the voltage measuring unit (the A/D converter 22 and the reference voltage generating circuit 12) even before the abnormal charging condition of the battery cell 40 is detected. When it is determined that the A/D converter 22 or the reference voltage generating circuit 12 deteriorates, it is possible to stop the charging operation of the battery cell 40 even before the abnormal charging condition of the battery cell 40 is detected, so that an erroneous operation or the like of the application occurred in the abnormal charging condition may be prevented in advance and an accident such as ignition may be prevented in advance. Furthermore, it is the control section 30 that periodically executes the deterioration determining step of the A/D converter 22 and the reference voltage generating circuit 12, and periodically executes the self diagnosis. Further, according to the embodiment of the present invention, since it is checked whether the A/D conversion value output from the A/D converter 22 is equal to a predetermined value, it is possible to detect the deterioration even when there is gradual deterioration in the characteristic of the voltage measuring unit (the A/D converter 22 and the reference voltage generating circuit 12).

Second Embodiment

The second embodiment is the same as the first embodiment until it is determined whether the A/D converter 22 is normal. When it is determined that the A/D converter 22 is normal, in the first embodiment, the diagnosis of the first reference voltage circuit 12 is performed in a manner such that the first reference voltage V1 is supplied from the first reference voltage output terminal 122 of the first reference voltage generating circuit 12 to the reference voltage input section 222 of the A/D converter 22 by connecting the terminal 241 and the terminal 243 to each other, the second divided voltage V2/n is input from the second divided voltage output section 124 of the second reference voltage generating circuit 12 to the A/D conversion voltage input section 224 of the A/D converter 22 by connecting the terminal 242 and the terminal 247 to each other, and the A/D conversion value of the second divided voltage V2/n, which is A/D converted using the first reference voltage V1 as a reference, is output to the comparing section 32 by the A/D converter 22. However, in the second embodiment, as shown in FIG. 4, the diagnosis of the first reference voltage circuit 12 is performed in a manner such that the second reference voltage V2 is supplied from the second reference voltage output terminal 142 of the second reference voltage generating circuit 14 to the reference voltage input section 222 of the A/D converter 22 by connecting the terminal 241 and the terminal 246 to each other, the second divided voltage V1/n is input from the first divided voltage output section 124 of the first reference voltage generating circuit 12 to the A/D conversion voltage input section 224 of the A/D converter 22 by connecting the terminal 242 and the terminal 244 to each other, and the A/D conversion value of the first divided voltage V1/n, which is A/D converted using the second reference voltage V2 as a reference, is output to the comparing section 32 by the A/D converter 22.

Figure 4:
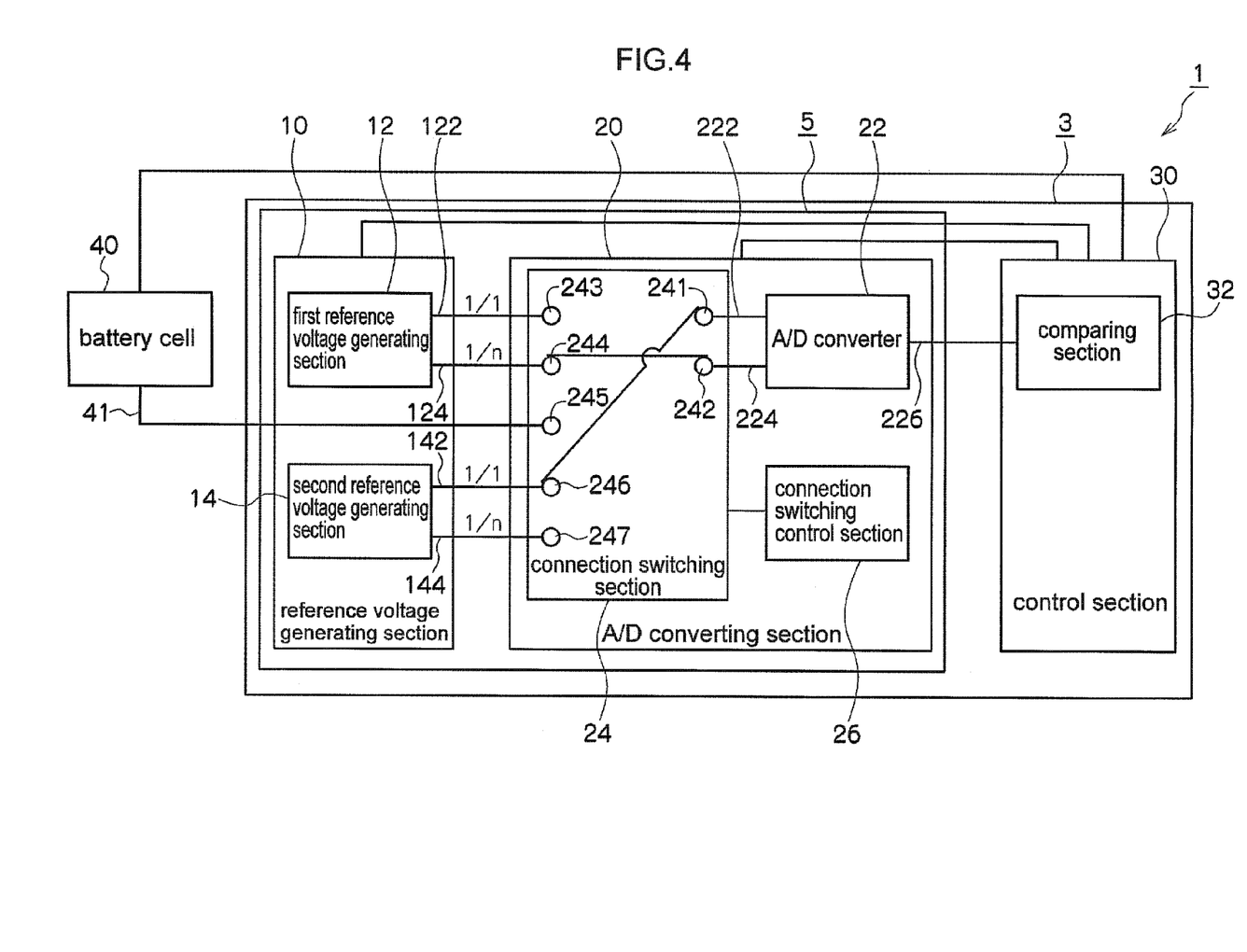
FIG. 4 is a schematic diagram for explaining a battery charger in accordance with a second embodiment of the present invention.

Referring to FIG. 4, the diagnosis operation of the first reference voltage circuit 12 of the present embodiment will be more specifically described. The connection switching control section 26 is controlled through the control of the control section 30, and the connection switching section 24 is controlled through the control of the connection switching control section 26, so that the second reference voltage output terminal 142 of the second reference voltage generating circuit 14 is connected to the reference voltage input section 222 of the A/D converter 22 by connecting the terminal 241 and the terminal 246 to each other, and the first divided voltage output section 124 of the first reference voltage generating circuit 12 is connected to the A/D conversion voltage input section 224 of the A/D converter 22 by connecting the terminal 242 and the terminal 244 to each other.

The second reference voltage V2 is supplied from the first reference voltage output terminal 142 of the second reference voltage generating circuit 14 to the reference voltage input section 222 of the A/D converter 22, the first divided voltage V1/n is input from the second divided voltage output section 124 of the first reference voltage generating circuit 12 to the A/D conversion voltage input section 224 of the A/D converter 22, and the A/D conversion value of the first divided voltage V1/n, which is A/D converted using the second reference voltage V2 as a reference, is output to the comparing section 32 by the A/D converter 22.

The A/D conversion value of the first divided voltage V1/n that is A/D converted on the basis of the second reference voltage V2 is input to the comparing section 32 installed in the control section 30, and is compared with the A/D conversion value of the predetermined desired first divided voltage V1/n output on the basis of the first reference voltage V1 when the first reference voltage generating circuit 12 is normal in the case where the A/D converter 22 and the first reference voltage generating circuit 12 are normal.

Since the first reference voltage V1 and the second reference voltage V2 are equal to each other when the first reference voltage generating circuit 12 is normal, when the A/D conversion value of the first divided voltage V1/n that is A/D converted on the basis of the second reference voltage V2 is equal to the A/D conversion value of the predetermined desired first divided voltage V1/n, it is determined that the first reference voltage generating circuit 12 does not deteriorate, and the operation of the application is continued.

When the two are not equal to each other, it is determined that the first reference voltage generating circuit 12 deteriorates, so that the operation of the application is stopped and the charging operation of the battery cell 40 is stopped.

For example, when the first reference voltage V1 is 5 V in the case where the first reference voltage generating circuit 12 is normal and the first divided voltage V1/n is 2.5 V, the second reference voltage V2 is 5 V and the second divided voltage V2/n is 2.5 V. As a result, 2.5 V of the first divided voltage V1/n is A/D converted with 5 V of the second reference voltage V2 as a reference. For example, in the case of 4 bits, "0111" is output with respect to "1111". In this case, when the first reference voltage generating circuit 12 deteriorates so that the first reference voltage V1 becomes V1' of 4.4 V at 5 V, the first divided voltage V1'/n becomes 2.2 V. Then, since the A/D converter 22 A/D converts the first divided voltage V1'/n (=2.2 V) on the basis of the second reference voltage V2 (=5 V), "0110" is output as the A/D conversion value with respect to "1111", so that the A/D conversion values are not equal to each other.

Only the first reference voltage generating circuit 12 is used to monitor the charging operation of the battery cell 40, and the second reference voltage generating circuit 14 is shut down and is not operated. The second reference voltage generating circuit 14 is activated only in the case of diagnosing the first reference voltage generating circuit 12 of the A/D converting device 5. For this reason, the deterioration degree of the second reference voltage generating circuit 14 is very small. For this reason, when it is determined whether the A/D conversion value of the first divided voltage V1/n based on the second reference voltage V2 is a specified value, the deterioration of the first reference voltage generating circuit 12 may be determined As described above, according to the second embodiment, since the reference voltage generating circuit 14 is additionally provided, it is possible to determine whether the A/D converter 22 deteriorates or the reference voltage generating circuit 12 deteriorates. When the deterioration determining step of the A/D converter 22 and the reference voltage generating circuit 12 is periodically performed during the charging monitoring step of the battery cell 40, it is possible to detect the abnormality of the voltage measuring unit (the A/D converter 22 and the reference voltage generating circuit 12) even before the abnormal charging condition of the battery cell 40 is detected. When it is determined that the A/D converter 22 or the reference voltage generating circuit 12 deteriorates, it is possible to stop the charging operation of the battery cell 40 even before the abnormal charging condition of the battery cell 40 is detected, so that an erroneous operation or the like of the application caused in the abnormal charging condition may be prevented in advance and an accident such as ignition may be prevented in advance. Further, according to the present embodiment of the present invention, since it is checked whether the A/D conversion value output from the A/D converter 22 is equal to a predetermined value, it is possible to detect the deterioration even when there is gradual deterioration in the characteristic of the voltage measuring unit (the A/D converter 22 and the reference voltage generating circuit 12).

Furthermore, as described above, in the first and second embodiments, the first divided voltage V1/n obtained by dividing the first reference voltage V1 on the basis of the first reference voltage V1 of the first reference voltage circuit 12 is A/D converted for the diagnosis of the A/D converter 22 and the diagnosis of the first reference voltage circuit 12. As a result, the output A/D conversion value becomes a value obtained by dividing the first reference voltage V1 in accordance with a constant ratio. When the A/D converter is normal even if the reference voltage of the first reference voltage V1 is not the original value due to the deterioration in the characteristics, the conversion value of the A/D converter is equal to the predetermined reference value, whereby the characteristics of the A/D converter may be accurately diagnosed. On the other hand, when it is determined whether the A/D converter is normal by comparing the A/D conversion value of the first reference voltage V1 with the A/D conversion value of the first reference voltage V1 when the first reference voltage circuit 12 is normal without using the first divided voltage V1/n obtained by dividing the first reference voltage V1, if the first reference voltage circuit 12 deteriorates even when the A/D converter is normal, the A/D conversion values are not equal to each other. As a result, there is a problem in that the A/D converter cannot be accurately diagnosed.

Further, in the first embodiment, the diagnosis of the first reference voltage circuit 12 is performed in a manner such that the connection of the A/D conversion voltage input section 224 of the A/D converter 22 originally receiving the voltage of the battery cell 40 when the charging operation of the battery cell 40 is monitored is switched by the connection switching section 24 to the second divided voltage output section 144 of the second reference voltage circuit 14 to receive the second divided voltage. In the second embodiment, the diagnosis of the first reference voltage circuit 12 is performed in a manner such that the connection of the A/D conversion voltage input section 224 of the A/D converter 22 originally receiving the voltage of the battery cell 40 when the charging operation of the battery cell 40 is monitored is switched by the connection switching section 24 to the first divided voltage output section 124 of the first reference voltage circuit 12 to receive the first divided voltage, and the connection of the reference voltage input section 222 of the A/D converter 22 is switched from the first reference voltage output terminal 122 of the first reference voltage generating circuit 12 to the second reference voltage output terminal 142 of the second reference voltage generating circuit 14 to receive the second reference voltage V2. For this reason, in order to diagnose the first reference voltage generating circuit 12, it is not necessary to use a comparator comparing the first reference voltage V1 and the second reference voltage V2 with each other, and it is possible to suppress an increase in the chip area.

Furthermore, in the first and second embodiments, an example has been described in which the invention is applied to a battery charging control device such as a battery monitoring IC monitoring the charging condition of the battery cell, but the present invention may be applied to an application that requires precision measurement and is capable of stopping the operation after it is determined that a reference voltage generating circuit deteriorates. Further, the battery charging control device 3 functions as a voltage monitoring device when the battery charging control device 3 does not monitor the charging condition of the battery cell 40, but monitors the voltage of the connection subject connected to the terminal 245 instead of the battery cell 40.

Although various exemplary embodiments have been shown and described, the invention is not limited to the embodiments shown. Therefore, the scope of the invention is intended to be limited solely by the scope of the claims that follow.

What is claimed is:

1. A battery charger comprising:
   a battery cell;
   a reference voltage generating section;
   an A/D converting section; and
   a control section,
   wherein the reference voltage generating section includes a first reference voltage circuit generating a first reference voltage and a second reference voltage circuit generating a second reference voltage equal to the first reference voltage,
   wherein the A/D converting section includes an A/D converter, a connection switching section, and a connection switching control section controlling the connection switching section, wherein the control section includes a comparing section, wherein when a charging condition of the battery cell is monitored, the control section controls the A/D converting section to connect the battery cell to the A/D converter and to output a first A/D conversion value by A/D converting a voltage value of the battery cell via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to a second divided voltage output section outputting a second divided voltage of the second reference voltage of the second reference voltage circuit so that a voltage dividing ratio of the second divided voltage with respect to the second reference voltage is equal to a voltage dividing ratio of the first divided voltage with respect to the first reference voltage and to output a third A/D conversion value obtained by A/D converting the second divided voltage via the A/D converter using the first reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

2. The battery charger according to claim 1, wherein the control section stops a charging operation of the battery cell when the second A/D conversion value and the second reference value are not equal to each other, diagnoses the characteristics of the first reference voltage circuit when the second A/D conversion value and the second reference value are equal to each other, and stops the charging operation of the battery cell when the third A/D conversion value and the third reference value are not equal to each other.

3. A voltage monitoring device comprising:
a connection terminal to be connected to a voltage monitoring target;
a reference voltage generating section;
an A/D converting section; and
a control section,
wherein the reference voltage generating section includes a first reference voltage circuit generating a first reference voltage and a second reference voltage circuit generating a second reference voltage equal to the first reference voltage,
wherein the A/D converting section includes an A/D converter, a connection switching section, and a connection switching control section controlling the connection switching section, wherein the control section includes a comparing section, wherein when a voltage of the voltage monitoring target is monitored, the control section controls the A/D converting section to connect the connection terminal to the A/D converter and to output a first A/D conversion value by A/D converting a voltage value of the voltage monitoring target via the A/D converter using the first reference voltage, and the control section controls the comparing section to compare the first A/D conversion value with a predetermined first reference value, wherein when characteristics of the A/D converter are diagnosed, the control section controls the A/D converting section to connect the A/D converting section to a first divided voltage output section outputting a first divided voltage of the first reference voltage of the first reference voltage circuit and to output a second A/D conversion value obtained by A/D converting the first divided voltage via the A/D converter using the first reference voltage, and the control section controls the comparing section to compare the second A/D conversion value with a second reference value obtained by A/D converting the first divided voltage via the A/D converter using the first reference voltage when the A/D converter is normal, and wherein when characteristics of the first reference voltage circuit are diagnosed, the control section controls the A/D converting section to connect the A/D converting section to a second divided voltage output section outputting a second divided voltage of the second reference voltage of the second reference voltage circuit so that a voltage dividing ratio of the second divided voltage with respect to the second reference voltage is equal to a voltage dividing ratio of the first divided voltage with respect to the first reference voltage and to output a third A/D conversion value obtained by A/D converting the second divided voltage via the A/D converter using the first reference voltage, and the control section controls the comparing section to compare the third A/D conversion value with a third reference value obtained by A/D converting the first divided voltage via the A/D converter using the first reference voltage when the first reference voltage circuit is normal in a case where the A/D converter and the first reference voltage circuit are normal.

4. A self-diagnosis method of a reference voltage circuit supplying an A/D conversion reference voltage to an A/D converter comprising:
connecting an A/D converting section to a first divided voltage output section outputting a first divided voltage of the reference voltage of the reference voltage circuit, obtaining a first A/D conversion value by A/D converting the first divided voltage via the A/D converter using the reference voltage, and comparing the first A/D conversion value with a first reference value obtained by A/D converting the first divided voltage via the A/D converter using the reference voltage when the A/D converter is normal; and
connecting the A/D converting section to a second divided voltage output section outputting a second divided voltage of a second reference voltage of a second reference voltage circuit generating the second reference voltage equal to the reference voltage so that the voltage dividing ratio of the second divided voltage with respect to the second reference voltage is equal to the voltage dividing ratio of the first divided voltage with respect to the reference voltage when the first A/D conversion value is equal to the first reference value, obtaining a second A/D conversion value by A/D converting the second divided voltage via the A/D converter using the reference voltage, and comparing the second A/D conversion value with a second reference value obtained by A/D converting the first divided voltage via the A/D converter using the reference voltage when the reference voltage circuit is normal in the case where the A/D converter and the reference voltage circuit are normal.

5. The self-diagnosis method of the reference voltage circuit according to claim 4, wherein the self-diagnosis is periodically performed.

6. The self-diagnosis method of the reference voltage circuit according to claim 4, further comprising:
   stopping the operation of a subject that is A/D converted by the A/D converting section when the first A/D conversion value and the first reference value are not equal to each other.

7. The self-diagnosis method of the reference voltage circuit according to claim 4, further comprising:
   stopping the operation of a subject that is A/D converted by the A/D converting section when the second A/D conversion value and the second reference value are not equal to each other.

* * * * *